United States Patent [19]

Finicle

[11] Patent Number: 5,671,322
[45] Date of Patent: Sep. 23, 1997

[54] LATERAL FLASH EVAPORATOR

[75] Inventor: Robert L. Finicle, Bay Village, Ohio

[73] Assignee: Advanced Ceramics Corporation, Cleveland, Ohio

[21] Appl. No.: 586,326

[22] Filed: Jan. 17, 1996

[51] Int. Cl.$^6$ ............... C23C 14/00; C23C 16/00
[52] U.S. Cl. ............... 392/389; 118/726; 432/262; 427/592
[58] Field of Search ............... 392/388, 389; 118/726, 727; 432/262, 264, 156; 427/592, 593, 250

[56] References Cited

U.S. PATENT DOCUMENTS

| 3,746,502 | 7/1973 | Erhart et al. | 432/263 |
| 3,748,090 | 7/1973 | Ciuffini et al. | 432/263 |
| 4,264,803 | 4/1981 | Shinko | 392/389 |
| 4,773,852 | 9/1988 | Tanji et al. | 432/263 |
| 5,158,750 | 10/1992 | Fincile | 432/263 |
| 5,167,984 | 12/1992 | Melnyk et al. | 427/593 |
| 5,239,612 | 8/1993 | Morris | 392/389 |
| 5,395,180 | 3/1995 | Mariner | 392/389 |

*Primary Examiner*—Teresa J. Walberg
*Assistant Examiner*—Sam Paik
*Attorney, Agent, or Firm*—Eugene Lieberstein; Michael N. Meller

[57] ABSTRACT

A resistant heated flash evaporator including a body of any desired geometry having two opposite open sides, a cavity which forms a continuous open area extending from each of the two opposite sides and at least one metal evaporating surface facing the open area for evaporating metal laterally through the opposite sides of the cavity. The body is preferably composed of graphite and has a coating of pyrolyric boron nitride extending over a substantial portion of the body and over the metal evaporating surface formed by the cavity.

6 Claims, 4 Drawing Sheets

LATERAL FLASH EVAPORATOR

FIELD OF INVENTION

This invention relates to an improved resistance heated flash evaporator for the vaporization of metals and more particularly to a flash evaporator for metal evaporation in a substantially lateral direction.

BACKGROUND OF THE INVENTION

Thermal evaporation is a common method for coating metals such as aluminum, copper, zinc, tin, silver and gold onto various substrates of metal, glass and plastic. The metal coating may be formed from a flash or semi-continuous evaporation of metal using a resistance heater composed of a ceramic or metal vessel commonly referred to as a "boat" or from a wire filament. When a ceramic or metal boat serves as the electrical resistance heater a cavity is formed in the boat to function as a receptacle for the metal charge which may be inserted into the cavity prior to each evaporation cycle or fed into the cavity. The boat is connected to a source of electrical power and is heated to a temperature which will cause the metal charge in contact with the boat to melt and vaporize. The metal charge wets the cavity after melting and during evaporation causing metal evaporant to disperse from the boat in a direction substantially transverse to the cavity surface. Accordingly, if the boat is aligned in a horizontal direction during evaporation of the metal charge the metal evaporant will necessarily disperse upwardly from the cavity.

There are many applications requiring spherical or substantially lateral dispersion of the metal evaporant from the evaporation source. In such cases the substrate(s) may be arranged vertically relative to the evaporation source or circumferentially around the evaporation source. At present, a metal wire filament serves as the resistance heater for substantially all such applications. The metal wire filament is typically composed of tungsten and has a useful life of from 2 to 35 flashes when used to evaporate aluminum. In such case the circuit resistance of the wire filament changes dramatically during each flash cycle as a result of melting of the aluminum and wetting of the wire filament. Moreover, aluminum, which is often the preferred metal evaporant, will chemically attack a wire filament of tungsten thereby causing electrical resistance variations and substantially limiting its useful life.

SUMMARY OF THE INVENTION

A modified vessel or "boat" has been discovered in accordance with the present invention for use as a resistance heater to provide flash or semi-continuous evaporation of metal in a substantially lateral direction without incurring any of the disadvantages from the use of a wire filament resistance heater.

The flash evaporator of the present invention comprises: a body having two opposite open sides and a cavity extending from each of said two opposite open sides for forming a continuous open area between said opposite sides and with said body having at least one metal evaporating surface formed by said cavity facing said open area for evaporating metal into said open area and laterally through the opposite sides of the body.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

A resistance heated flash evaporator for the vaporization of metal may be composed of an intermetallic ceramic composite of titanium diboride and boron nitride alone or in combination with aluminum nitride. Alternatively the resistance heated flash evaporator may be composed of a graphite body having a coating of pyrolytic boron nitride ("PBN"). The PBN coated graphite evaporator is known to possess a longer useful life and is accordingly preferred for purposes of the present invention. A typical PBN coated graphite evaporator is taught in U.S. Pat. No's 4,264,803 and 5,239,612; the disclosure of each incorporated herein by reference.

Figure 1:
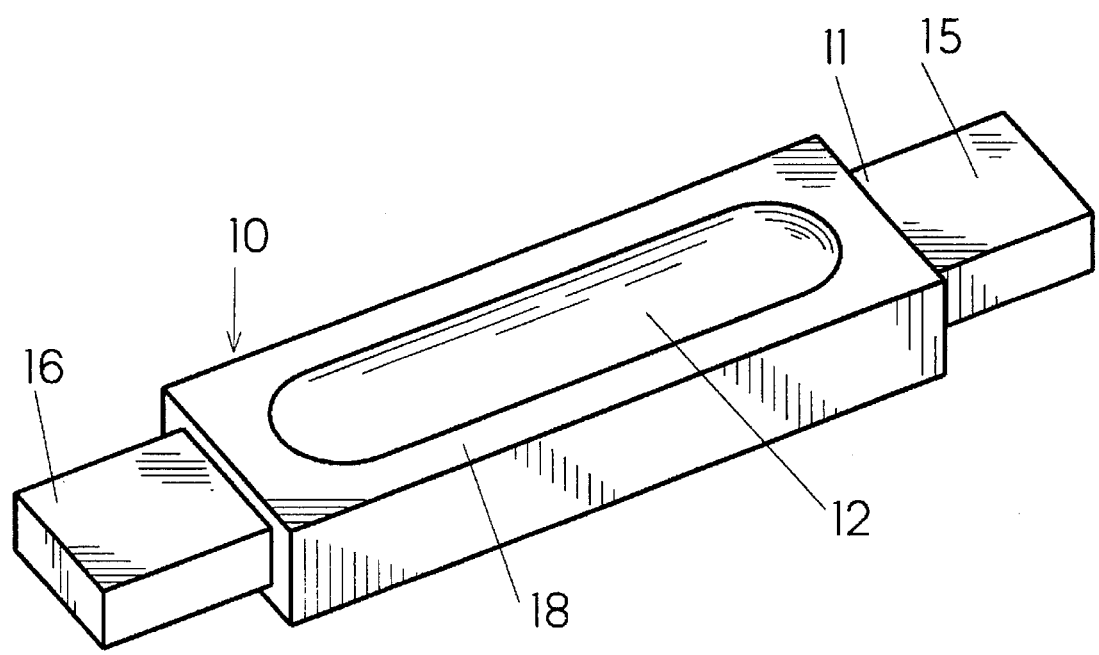
FIG. 1 is an isometric view of a typical flash evaporator of the prior art with a graphite body and a pyrolyric boron nitride outer coating.

The prior art pyrolyric boron nitride coated graphite evaporator as taught in the aforementioned patents is shown in FIG. 1. The body 11 of the evaporator 10 is preferably formed from a graphite block with a long and narrow geometry having a cavity or depression 12 machined therein from at least one surface 14. A thin layer of pyrolyric boron nitride 18 is coated over the body 11 of the evaporator 10.

The process for forming a pyrolytic coating of boron nitride is also conventional and briefly involves introducing vapors of ammonia and a gaseous boron halide in a suitable ratio into a heated furnace reactor containing the graphite body 11 with the furnace maintained at a controlled temperature of between 1600° C. to 2200° C. as explained in U.S. Pat. No. 3,182,006 the disclosure of which is herein incorporated by reference. In the prior art configuration of FIG. 1 the coating 18 of pyrolyric boron nitride is usually no thicker than 0.030 inches and fully encapsulates the graphite body 11 except at the ends 15 and 16 which are exposed for purposes of making an electrical connection through a clamp assembly (not shown) to an external source of power (not shown). The pyrolyric coating 18 may be removed from the ends 15 and 16 of the body 11 by a machining operation or the ends 15 and 16 may be masked during the coating operation to prevent coating of the ends 15 and 16.

The body 11 of the resistance heater 10 is preferably of a rectangular configuration having a predetermined cross sectional area to provide a defined resistance path which will optimize the heat generated therein for a given applied voltage to assure complete evaporation of the metal charge under controlled heat cycle conditions. It has been discovered in accordance with the present invention that a desirable resistance path may be established in a resistance heater of any desired geometry, to permit metal evaporation in substantially lateral directions through opposite sides of the heater as will be explained hereafter in detail in connection with FIGS. 2 and 3 inclusive.

Figure 2:
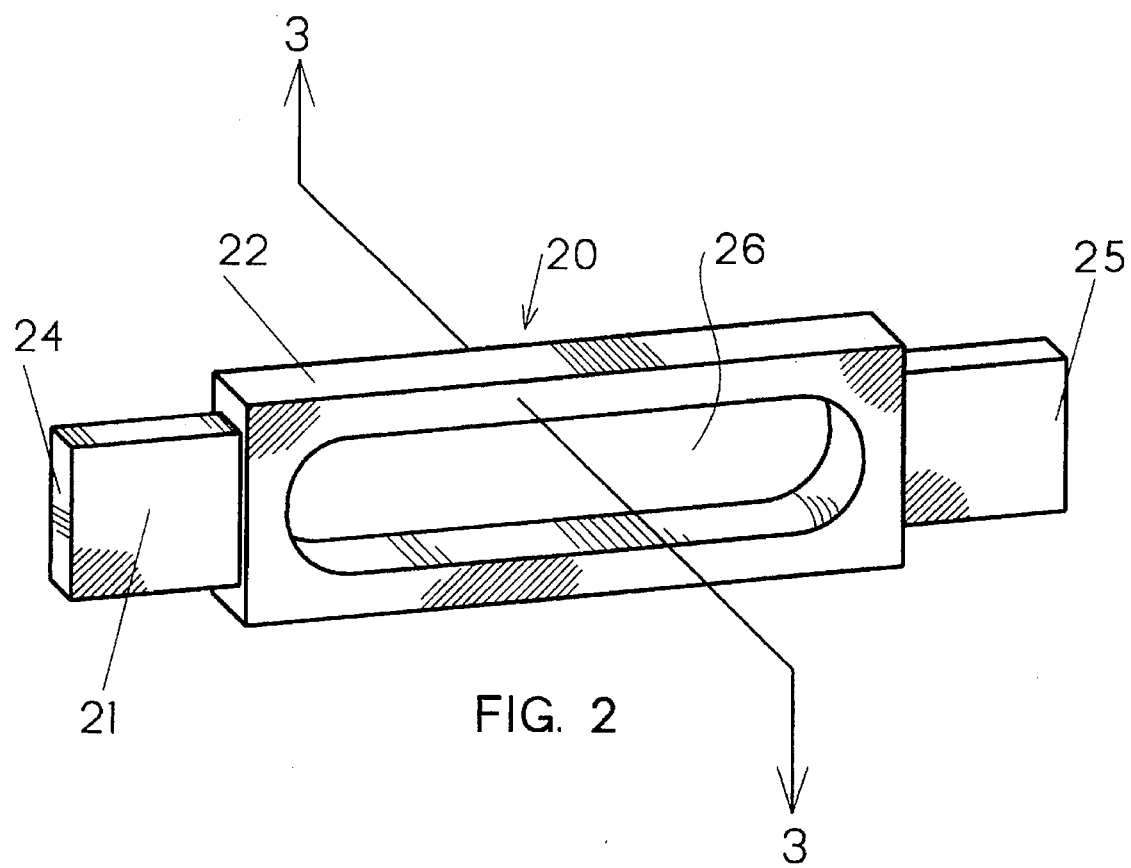
FIG. 2 is an isometric view of the flash evaporator vessel of the present invention.
Figure 3:
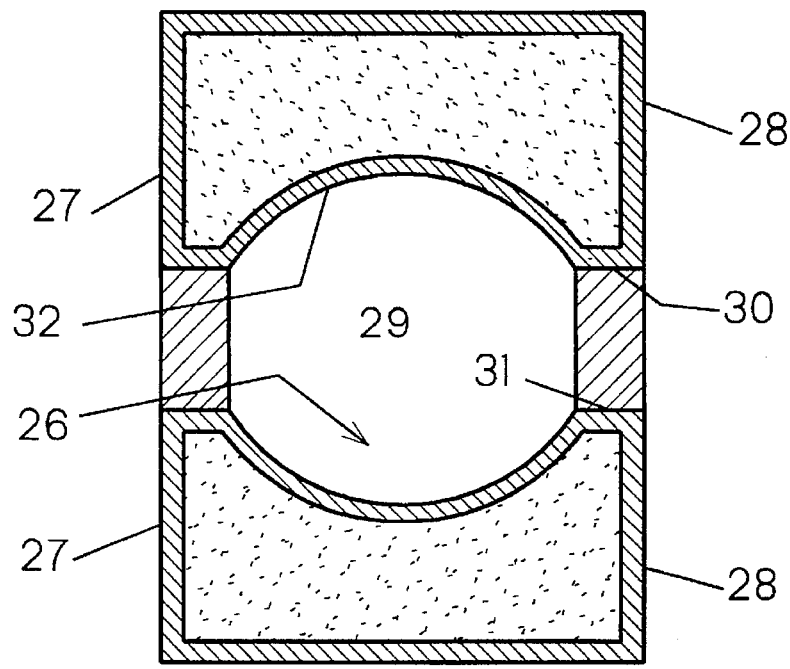
FIG. 3 is a view in cross section of the vaporization vessel of the present invention taken along the lines 3—3 of FIG. 2.
Figure 3A:
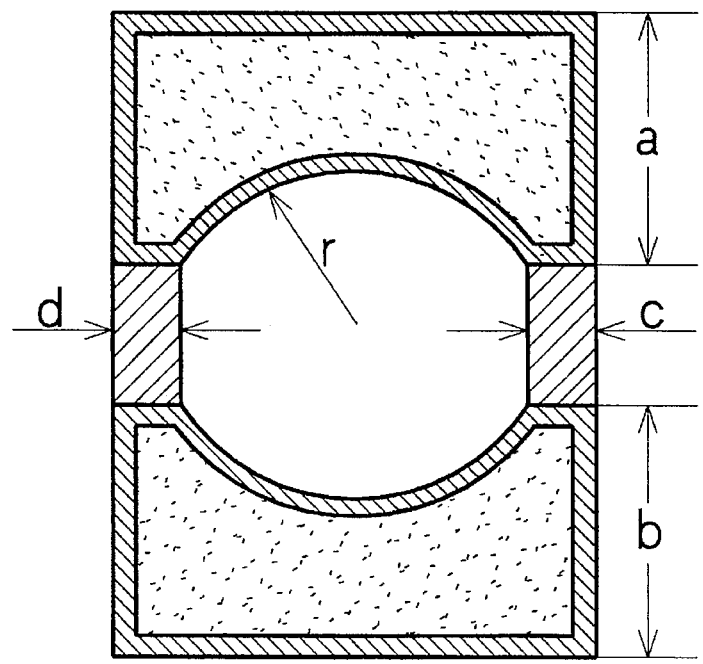
FIG. 3A is identical to FIG. 3 showing the more important dimensions of the vessel.

The resistance heated evaporator vessel 20 of the present invention as is shown in FIGS. 2 and 3 is preferably formed from a graphite body 21 having a desired geometry such as a rectangular or cylindrical solid with a coating 22 of pyrolyric boron nitride (PBN) although it is not limited to a PBN coated graphite construction. When evaporating aluminum the molten alumimum is insulated both electrically and chemically from the electrical resistor and its resistance characteristic therefore does not change over the life of the evaporator. Accordingly, a PBN coated evaporator has a useful life of from 500 to 3500 flashes which is two orders of magnitude over that of a wire filament.

The ends 24 and 25 of the graphite body 21 are left exposed or the coating 22 is machined to expose the ends 24 and 25 in order to facilitate attachment to a power supply (not shown) as taught in the above mentioned U.S. Pat. No's 4,264,803 and 5,239,612 respectively. A hollow cavity 26 is formed or machined into the body 21 to provide a continuous open area 29 extending between two opposite sides 27 and 28 of the body 21. The PBN coating is formed after forming the cavity 26 so that the PBN coating coats the surfaces of the cavity 26 facing the open area 29.

A cross section of the body 21 taken along the lines 3—3 is shown in FIG. 3. The hollow cavity 26 forms two complementary surfaces 30 and 31 facing the open area on opposite sides of the cavity 26. Either of the two surfaces, preferably both, may be used in accordance with the present invention as the evaporation surface for the evaporation of metal. The metal to be evaporated is placed upon or fed into contact with the evaporation surfaces 30 and 31 and evaporated simultaneously into the open area 29 with the evaporant discharging through the opposite open sides 27 and 28. When the vessel 20 is vertically or horizontally oriented the evaporation of metal from the vessel 20 will occur laterally in two directions from the open sides 27 and 28.

The complementary surfaces 30 and 31 may be of any geometry including a flat or curved surface. A surface having a concavity 32 is preferred. A depression of concave geometry may be formed in either or both surfaces 30 and 31 by machining a groove into the surface(s). The concavity 32 functions as a reservoir for the placement of metal before the start of each flash evaporation cycle equivalent to the depression 12 in the prior art vessel of FIG. 1. The area of the concavity 32 as determined from its radius of curvature "r" will control the amount of metal that can be evaporated in a single flash whereas the dimensions "a", "b", "c" and "d" of the vessel 20 as shown in FIG. 3 determines the area of irradiation of the metal evaporant and the defined resistance path to optimize the heat generated in the evaporator vessel 20.

Figure 4:
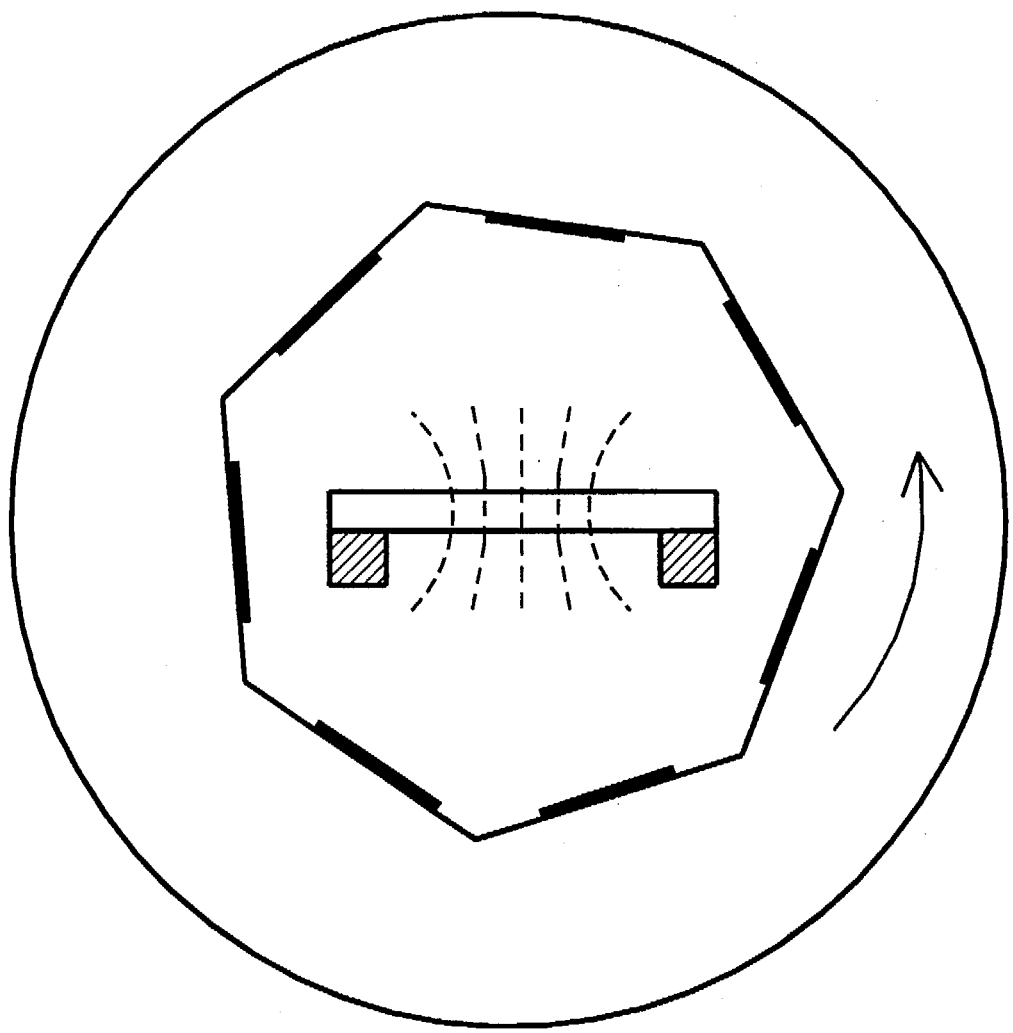
FIG. 4 is a diagrammatic illustration in cross section of an assembly of product arranged in a chamber for metal evaporation in accordance with the present invention.

One arrangement of product in accordance with the present invention is illustrated in FIG. 4 showing the resistance heated evaporator vessel 20 in the symmetrical center of a rotable cylinder inside the vacuum chamber 30 with product 32 such as laser disks mounted inside the cylinder for rotation with the chamber 30. The laser disks 32 are arranged symmetrically inside the vessel 20 for rotation on a rotable drum e.g. in a counterclockwise direction as shown by the arrow A1. This results in the metal evaporant depositing symmetrically over the entire surface of each product 32.

What we claim is:

1. A flash evaporator comprising: a body having opposite open sides and a cavity extending from each of said opposite open sides for forming a continuous open area between said opposite open sides with said body having at least one metal evaporating surface formed by said cavity facing said open area for evaporating metal into said open area and laterally through said opposite open sides of said body.

2. A resistant heated flash evaporator as defined in claim 1 wherein said body has a rectangular or cylindrical geometry.

3. A resistant heated flash evaporator as defined in claim 2 wherein the body of said evaporator is composed of graphite and wherein said evaporator further comprises a coating of pyrolyric boron nitride extending over a substantial portion of said body and over at least said metal evaporating surface facing said open area.

4. A resistant heated flash evaporator as defined in claim 3 wherein each of said opposite sides of said body has a substantially planar surface between which said continuous open area extends.

5. A resistant heated flash evaporator as defined in claim 4 wherein said cavity in said body forms two complementary surfaces with each having a PBN coating for evaporating metal laterally through said opposite sides of said hollow cavity.

6. A resistant heated flash evaporator as defined in claim 5 wherein at least one of said complementary surfaces has a concavity into which metal may be placed.

* * * * *